(12) United States Patent
Suzuki

(10) Patent No.: US 7,556,246 B2
(45) Date of Patent: Jul. 7, 2009

(54) UNLOADING METHOD OF OBJECT, PROGRAM STORAGE MEDIUM, AND MOUNTING MECHANISM

(75) Inventor: Masaru Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/560,904

(22) Filed: Nov. 17, 2006

(65) Prior Publication Data

US 2007/0118246 A1 May 24, 2007

(30) Foreign Application Priority Data

Nov. 21, 2005 (JP) .............................. 2005-336032

(51) Int. Cl.
*B25B 11/00* (2006.01)
(52) U.S. Cl. .............................. 269/21; 269/20; 269/47; 269/54.4; 269/54.5; 700/117; 700/121; 700/275; 700/282
(58) Field of Classification Search ................. 700/117, 700/213, 218, 121, 275, 282; 414/672, 935, 414/939, 225; 269/13, 21, 47, 48.1, 48.2, 269/20, 54.4, 54.5; 451/388; 137/807
See application file for complete search history.

(56) References Cited

U.S. PATENT DOCUMENTS

| 4,812,201 | A | * | 3/1989 | Sakai et al. .................. 438/725 |
| 4,908,095 | A | * | 3/1990 | Kagatsume et al. ........... 216/67 |
| 5,569,350 | A | * | 10/1996 | Osada et al. ........... 156/345.51 |
| 5,609,377 | A | * | 3/1997 | Tanaka ......................... 294/65 |
| 5,879,128 | A | * | 3/1999 | Tietz et al. .................. 414/757 |
| 5,923,408 | A | * | 7/1999 | Takabayashi ................. 355/53 |
| 6,089,763 | A | | 7/2000 | Choi et al. |
| 6,305,677 | B1 | * | 10/2001 | Lenz ............................ 269/13 |
| 6,517,420 | B2 | * | 2/2003 | Ishikawa et al. .............. 451/67 |
| 6,722,642 | B1 | * | 4/2004 | Sutton et al. .................. 269/21 |
| 6,955,516 | B2 | * | 10/2005 | Achkire et al. ............. 414/217 |
| 7,187,188 | B2 | * | 3/2007 | Andrews et al. ............ 324/760 |
| 7,292,428 | B2 | * | 11/2007 | Hanawa et al. .............. 361/234 |
| 2001/0024936 | A1 | * | 9/2001 | Ishikawa et al. .............. 451/67 |
| 2001/0050769 | A1 | * | 12/2001 | Fujinaka ..................... 356/121 |
| 2002/0006876 | A1 | * | 1/2002 | Hongo et al. ................ 505/191 |
| 2004/0112715 | A1 | * | 6/2004 | Miyamoto ............... 198/471.1 |
| 2005/0151549 | A1 | * | 7/2005 | Okumura et al. ............ 324/756 |

FOREIGN PATENT DOCUMENTS

KR 0257787 1/2000

* cited by examiner

*Primary Examiner*—Paul L Rodriguez
*Assistant Examiner*—Carlos Ortiz Rodriguez
(74) *Attorney, Agent, or Firm*—Oblon, Spivak, McClelland, Maier & Neustadt, P.C.

(57) ABSTRACT

There is provided a method for unloading an object vacuum-chucked on a mounting table having one or more gas flow paths opened at one or more locations on the mounting table, including the steps of (a) turning off a vacuum-chucking of the object vacuum-chucked via the gas flow paths; (b) lifting the object from the mounting table by using an object lifting unit; and (C) supplying a gas between the mounting table and the object during the step (b) via at least one of the gas flow paths. Further, there is also provided a program storage medium storing therein a computer executable program for executing the unloading method.

19 Claims, 2 Drawing Sheets

UNLOADING METHOD OF OBJECT, PROGRAM STORAGE MEDIUM, AND MOUNTING MECHANISM

FIELD OF THE INVENTION

The present invention relates to a method for unloading an object from a mounting table of a semiconductor manufacturing apparatus, and a program storage medium and a mounting mechanism; and, more particularly, to a method capable of unloading an object quickly and smoothly, which is vacuum-chucked on a mounting table, from the mounting table, a program storage medium storing a program for executing the method and a mounting mechanism.

BACKGROUND OF THE INVENTION

A mounting mechanism is used when performing a processing on an object such as a wafer. The mounting mechanism includes: a mounting table for mounting thereon the object; a plurality of elevating pins protrusible above and below a mounting surface of the mounting table; and a plurality of air flow paths opened at plural locations on the mounting surface to fixedly vacuum-chuck the object onto the mounting surface of the mounting table. By performing a vacuum pumping through the plurality of air flow paths with a vacuum pump, the object is fixedly vacuum-chucked on the mounting surface of the mounting table.

When performing a preset processing on the object, a transfer mechanism transfers the object to the mounting table and hands it over to the plurality of elevating pins protruded from the mounting surface. Then, the transfer mechanism retreats from the mounting table. Meantime, in the mounting mechanism, the plurality of elevating pins is moved down below the mounting surface of the mounting table so that the object is loaded on the mounting surface. Once the object is loaded and fixedly vacuum-chuck onto the mounting surface, the object is hermetically attracted and held by the mounting surface. After completing the processing on the object, the processed object is unloaded from the mounting table. The vacuum-chucking for the unloading process of the object onto the mounting table is released, and the plurality elevating pins are raised from the mounting table to lift the processed object therefrom. The transfer mechanism then receives the processed object lifted by the elevating pins to finally unload the object from the mounting table.

Further, disclosed in, for example, Japanese Patent Laid-open Application No. S63-142653 (Patent Reference 1) is a prober having a mounting mechanism (chuck) different from the type of the above-described mounting mechanism. The prober includes a chuck having a suction port in communication with a vacuum pump, wherein the air inlet of the chuck is slantingly installed toward the side of a loader and a blower is connected to the suction port via a changeover switch. In the prober having this configuration, air is blown through the suction port by the blower when unloading a wafer from the chuck. Accordingly, the wafer can be rapidly transferred from the chuck to the loader side by the air force generated in the air flow direction.

Moreover, disclosed in Japanese Utility Model Laid-open No. S50-127097 (Patent Reference 2) is a suctioning and vacuuming apparatus for a vacuum table. In this apparatus, an exhaust side and a suction side of a pump is connected with a chamber of the vacuum table via a direction changeover valve. By switching over the direction changeover valve, the chamber is made to communicate with either one of the exhaust side and the suction side of the pump selectively. When unloading a wafer W from the vacuum table, the vacuum table is configured to communicate with the exhaust side of the pump by means of controlling the direction changeover valve.

With regard to the conventional mounting mechanism having the elevating pins, however, the object is vacuum suctioned by the mounting surface and firmly adhered thereto. Thus, in order not to incur a depressurized state when unloading the processed object from the mounting surface of the mounting table, the object needs to be lifted up by the elevating pins at a very low speed while concurrently supplying exterior air between the object and the mounting surface gradually. Therefore, unloading the processed object takes a long time. For example, about 6 to 7 seconds are required to lift the processed object from the mounting surface to a transfer location. If the unloading of the object is quickly carried out rather quickly, a depressurized state may still persist between the object and the mounting table while the object is pushed up by elevating the plurality of the elevating pins; then, the central portion of the object would be lifted up earlier than the periphery thereof. As a result, the object would be bent greatly, which in turn may damage in the breakage of the wafer W. As the object increases in size and decreases in thickness, the likelihood of the object being damaged increases. In case of the apparatuses disclosed in Patent References 1 and 2, such problems of the mounting mechanism having the elevating pins do not exist since they do not have elevating pins.

SUMMARY OF THE INVENTION

It is, therefore, an object of the present invention to provide: a method, for use in a mounting mechanism having a plurality of elevating pins, capable of unloading an object such as a wafer, from a mounting table in a expeditious and smooth manner without damaging the object even in case the size of the object increases and the thickness thereof decreases; and a program storage medium and a mounting mechanism for use in executing the method.

In accordance with one aspect of the present invention, there is provided an unloading method of an object vacuum-chucked on a mounting table having one or more gas flow paths opened at one or more locations on the mounting table, including the steps of (a) turning off a vacuum-chucking of the object vacuum-chucked via the gas flow paths; (b) lifting the object from the mounting table by using an object lifting unit; and (c) supplying a gas between the mounting table and the object during the step (b) via at least one of the gas flow paths.

Further, the lifting step (b) may include a first and a second lifting step, and an object lifting speed in the second object lifting step is higher than that in the first object lifting step.

Further, the lifting step (c) may be performed during the first lifting step.

In accordance with another aspect of the present invention, there is provided a program storage medium storing therein a computer executable program for executing the unloading method in the above aspect of the present invention.

In accordance with still another aspect of the present invention, there is provided a mounting mechanism including a mounting table for mounting an object thereon; an object lifting unit moved up and down with respect to the mounting table to lift the object to and from the mounting table; one or more gas flow paths formed in the mounting table to be opened at one or more locations on a mounting surface of the mounting table, for vacuuming-chucking the object on the mounting table; and a gas supply unit for supplying a gas between the mounting table and the object via at least one of the air flow paths.

Further, the object lifting unit may have at least two lifting speeds.

Further, the mounting table may be configured to mount thereon one of at least two types of objects having different sizes, and one or more openings of said at least one of the gas flow paths is formed in a region of the mounting table on which an object of the smallest size is placed.

Further, an exhausting unit may be connected to each of the gas flow paths, and said at least one of the gas flow paths selectively communicates with either one of the exhausting unit and the gas supply unit via a valve.

Further, the valve may include a device for controlling a flow rate of the gas.

In accordance with the present invention, an object such as a wafer can be unloaded, from a mounting table in a expeditious and smooth manner without damaging the object even in case the size of the object increases and the thickness thereof decreases.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
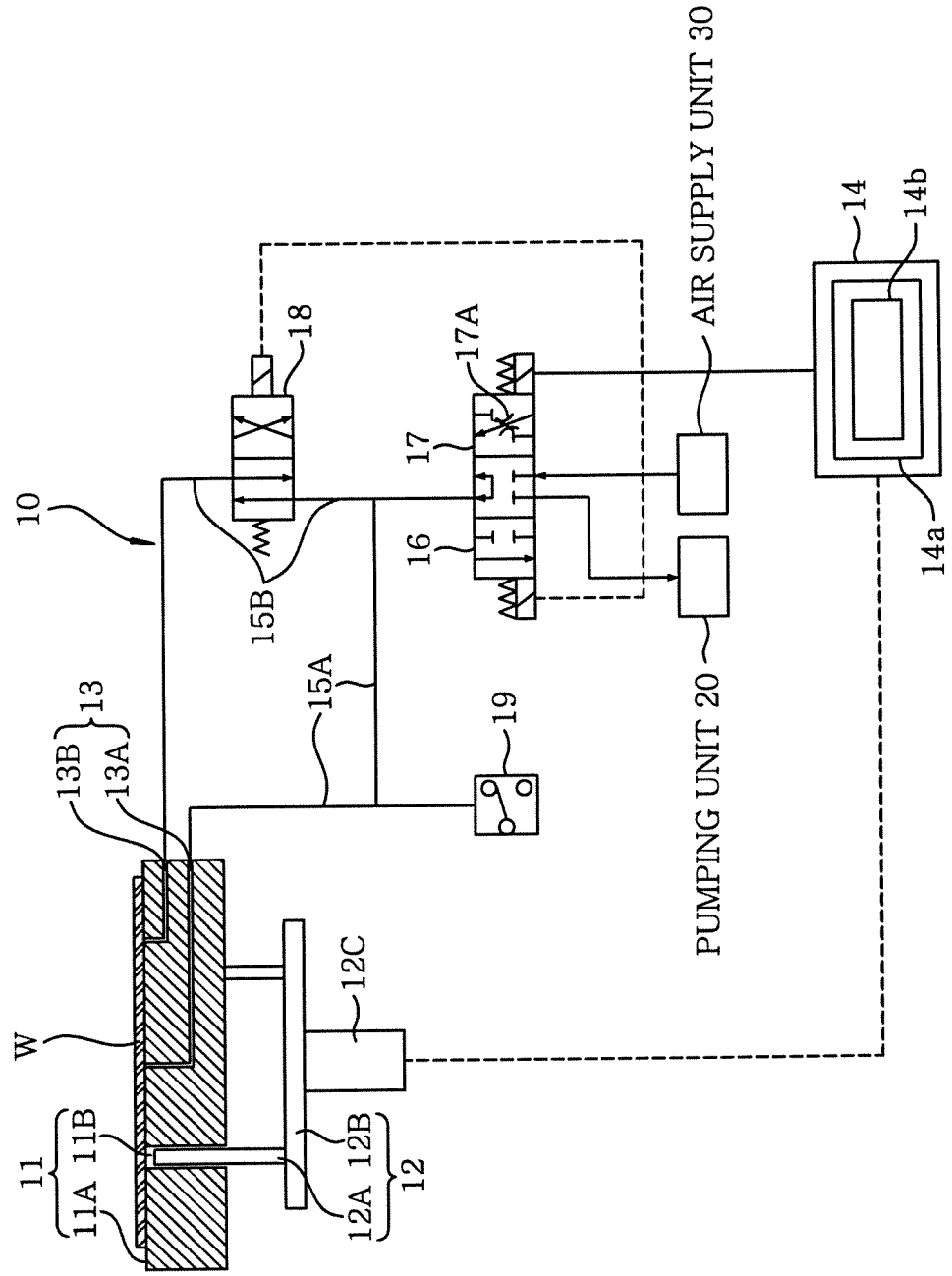
FIG. 1 is a configuration view of a mounting mechanism in accordance with a preferred embodiment of the present invention.

As illustrated in FIG. 1, a mounting mechanism 10 in accordance with the embodiment of the present invention includes, for example, a mounting table 11 for mounting an object (e.g., a wafer) W thereon; an object lifting unit 12 which moves up and down with respect to a mounting surface 11A of the mounting table 11 to transfer the wafer W to and from the mounting table 11; and a plurality of air flow paths provided in the mounting table 11 in such a manner as to be opened at plural locations on the mounting surface 11A. The mounting mechanism 10 is operated under the control of a controller 14 to vacuum-chuck the wafer W on the mounting surface 11A. The mounting mechanism 10 can be advantageously employed in a semiconductor manufacturing apparatus such as an inspection apparatus for inspecting electrical characteristics of the wafer W, for example.

The mounting table 11 has a mounting surface having a size capable of mounting thereon for example two types of wafers W having different diameters (for example, wafers having diameters of 200 mm and 300 mm). As illustrated in FIG. 1, the object lifting unit 12 configured to be moved up and down with respect to the mounting surface 11A includes, for example, three elevating pins 12A (only two are shown in FIG. 1) and a connection member 12B for connecting lower ends of the elevating pins 12A. The object lifting unit 12 is set up to be moved up and down by a conventional elevation driving mechanism 12C. The three elevating pins 12A move up and down through three through holes 11B arranged, e.g., to form a regular triangle at a central portion of the mounting table 11, and serve to transfer the wafer W at their uppermost raised position. Further, the elevation driving mechanism 12C is operated according to a sequence program stored in, e.g., a program storage medium 14b of a computer 14a of the controller 14 and changes step-by-step the rising speed of the wafer W being raised by the three elevating pins 12a, so as to allow the wafer W to be lifted up to the uppermost raised position from the mounting surface 11A in a short period of time.

Further, a number of circular grooves are formed in a concentric manner on the mounting surface 11a of the mounting table 11, and the plurality of air flow paths 13 are opened in the circular grooves. The air flow paths 13 have a dual system with a first air flow path 13A opened at a region for placing thereon a wafer W of 200 mm and a second air flow path 13B opened at a region outside where the first air flow path 13A is formed and for placing thereon a wafer W of 300 mm. In case of vacuum-chucking the wafer W of 300 mm on the mounting surface 11, the first and the second flow path 13A and 14B are both used. Further, the circular grooves in which the first air flow path 13A is opened are communicated with each other via, e.g., one or more grooves formed in diametrical directions, and the circular grooves in which the second air flow path 13B is opened are also communicated with each other in a same manner.

A first and a second electromagnetic valve 16 and 17 are switchably connected to an inlet of the first air flow path 13A via a first exhaust line 15A. By means of switching the first and the second electromagnetic valve 16 and 17, the first exhaust line 15A is set up to communicate with an exhausting unit 20 and an air supply unit 30, respectively. Further, the second electromagnetic valve 17 has a throttle valve 17A which operates when the first exhaust line 15A is connected to the air source side, and the flow rate of the air supplied between the mounting table 11 and the wafer W can be properly controlled by means of the throttle valve 17A. In addition, the first exhaust line 15A is also connected to an inlet of the second air flow path 13B via a second exhaust line 15B. Also, a third electromagnetic valve 18 is installed on the second exhaust line 15B, and the first and the third electromagnetic valve 16 and 18 are operated together when necessary. Further, a vacuum sensor 19 having a switch is connected to the first exhaust line 15A to detect a vacuum level between the mounting table 11 and the wafer W when its switch is on.

Thus, to vacuum-chuck a wafer of 300 mm on the mounting table 11 hermetically, the first and the third electromagnetic valve 16 and 18 are actuated, whereby the first and the second flow path 13A and 13B are allowed to communicate with the vacuum pump via the first and the second exhaust line 15A and 15B. Concurrently, the vacuum sensor 19 detects a vacuum level between the mounting table 11 and the wafer W. To lift up the wafer W from the mounting table 11, the first and the third electromagnetic valve 16 and 18 are deactivated and the second electromagnetic valve 17 is activated, whereby the first air flow path 13A is set up to communicate with the air source via the first exhaust line 15A.

Now, an operation of the mounting mechanism 10 will be explained with reference to FIGS. 2A to 2D. In FIGS. 2A to 2D, only the first air flow path 13A is shown. In case of performing a processing on a wafer W having a diameter of 300 mm, a transfer mechanism transfers the wafer W to the three elevating pins 12A of the object lifting unit 12 which are in a stand-by state at the uppermost raised position. Then, the transfer mechanism retreats and the three elevating pins 12A are moved down through the through holes 11B by the elevation driving mechanism 12C so that the wafer W is loaded on the mounting surface 11A. In the meantime, the first and the third electromagnetic valve 16 and 18 are actuated, and the first and the second flow path 13A and 13B are set to communicate with the vacuum pump, so that the wafer W is vacuum-chucked on the mounting surface 11A with a suction force of, e.g., about −40 kPa. At this moment, the elevating pins 12A of the object lifting unit 12 are positioned at the lowermost position, and their top ends are positioned below the mounting surface 11A. Then, upon completing the processing on the wafer W, the wafer W is unloaded from the mounting table 11.

To unload the wafer W from the mounting table 11, the first to the third electromagnetic valve 16, 17 and 18 are operated according to the sequence program of the controller 14, and, at the same time, the elevation driving mechanism 12C is driven to lift up the object lifting unit 12 (three elevations pins 12A) such that the wafer W is raised from the mounting surface 11a up to a position where its transfer is performed.

Figure 2A:
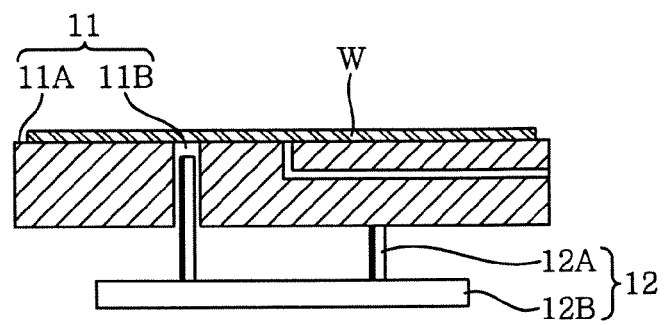
FIGS. 2A to 2D provide cross sectional views describing an unloading process of a object performed by using the mounting mechanism shown in FIG. 1 in accordance with the preferred embodiment of the present invention.
Figure 2B:
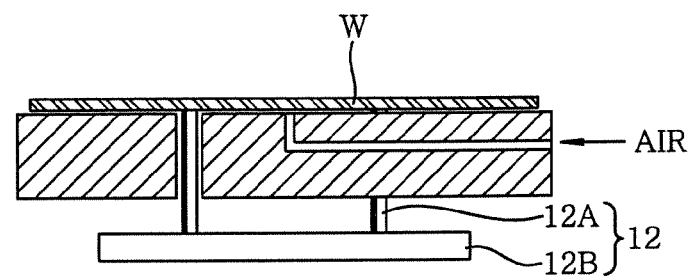

Specifically, the three elevating pins 12A are moved up by the elevation driving mechanism 12C at a high speed (e.g., 20 mm/s) until their top ends reach a height lower than the mounting surface 11A by 1.0 mm, as shown in FIG. 2A. Thereafter, the first and the second electromagnetic valve 16 and 18 are actuated, whereby the vacuum chucking of the wafer W to the mounting surface 11A is released. Then, after confirming that the vacuum sensor 19 is turned off, the three elevating pins 12A are elevated by the elevation driving mechanism 12C up to a height shown in FIG. 2B from the position shown in FIG. 2A at a low speed (e.g., 1.5 mm/s) for one second, finally contacting the rear surface of the wafer W and then lifting up the wafer W from the mounting surface 11A by 0.5 mm. Therefore, a misalignment of the wafer W can be prevented even with the air supplied between the wafer W and the mounting table 11.

Figure 2C:
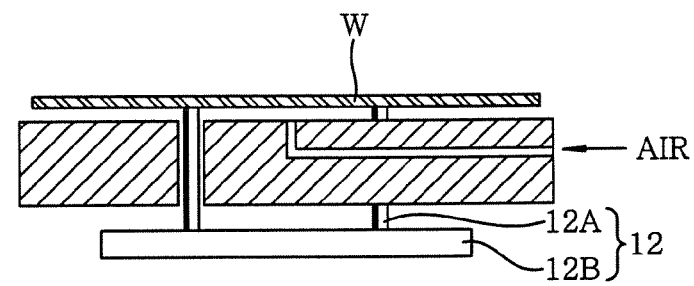
Figure 2D:
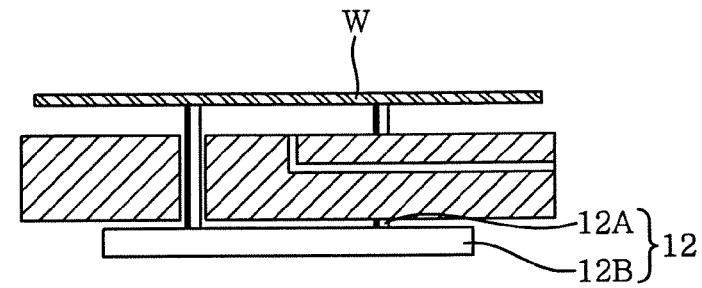

Subsequently, the second electromagnetic valve 17 is actuated, and the first air flow path 13A is set to communicate with the air source, whereby air of 0.4 to 0.45 MPa is supplied into the first air flow path 13A from the air source via the second electromagnetic valve 17 and the first exhaust line 15A. After the lapse of 50 milliseconds, the three elevating pins 12A are elevated by the elevation driving mechanism 12C at a low speed (e.g., 1.5 mm/s) for one second, thereby lifting the wafer W from the mounting surface 11A by 2.0 mm, as shown in FIG. 2C. As a result, introduction of the air into the gap between the wafer W and the mounting surface 11A can be facilitated. Further, the amount of the air introduced into the first air flow path 13A can be set at an optimum value by using the throttle valve 17A of the second electromagnetic valve 17.

Subsequently, while supplying air between the mounting table 11A and the wafer W from the air source, the three elevating pins 12A are raised upward at a high speed (e.g., 20 mm/s), to thereby lift the wafer W from the mounting surface 11A up to the transfer position (i.e., the uppermost raised position), e.g., up to a height of 12.0 mm above the mounting surface 11A very quickly for about 0.5 second. At this time, even if the speed for raising the wafer W is set high, the gap between the wafer W and the mounting surface 11A does not turn into a depressurized state, because of an inflow of ambient air around the wafer W into the gap.

Accordingly, in accordance with the preferred embodiment of the present invention, the elevating pins 12A can be raised from the position 1.0 mm below the mounting surface 11A up to the transfer position in about 2.5 seconds. Thus, in comparison with 6 to 7 seconds conventionally required for the unloading of the wafer W, the unloading time of the wafer W can be reduced considerably in accordance with the embodiment of the present invention.

If the elevating pins 12A are elevated as described above and finally stopped at the transfer position of the wafer W, the second electromagnetic valve 17 is actuated, and the communication of the first air flow path 13A with the air source is cut. In this state, the wafer W raised from the mounting surface 11A is unloaded by the transfer mechanism so as to be replaced with a new wafer W.

Though the above embodiment of the present invention has been described for the case of processing the wafer W having a diameter of 300 mm, the unloading process of a wafer having a diameter of 200 mm can also be performed through the same manner as that of the wafer of 300 mm excepting that the third electromagnetic valve 18 is always in an de-actuated state so as not to be used in vacuum-chucking the wafer W. Accordingly, as for the wafer of 200 mm, the same effect can be obtained as in the embodiment of the present invention.

In accordance with the preferred embodiment of the present invention as described above, the mounting mechanism includes: the mounting table 11 for mounting the wafer W thereon; the object lifting unit 12 moved up and down with respect to the mounting table 11 to transfer the wafer W on the mounting table 11; the first and the second air flow path 13A and 13B opened at plural locations on the mounting surface 11A of the mounting table 11 to vacuum-chuck the wafer W onto the mounting surface 11A; and the air source provided as an air supply unit for supplying air between the mounting table 11 and the wafer W via the first air flow path 13A. Thus, when lifting up the wafer W from the mounting table 11 via the object lifting unit 12, the wafer W being vacuum-chucked onto the mounting surface 11A via the first and the second air flow path 13A and 13B opened at plural locations on the mounting table 11, and then unloading the wafer W from the mounting table 11, the depressurized state between the mounting surface 11A and the wafer W can be released by supplying air between the mounting table 11 and the wafer W from the first air flow path 13A after lifting up the wafer W by using the object lifting unit 12. Thus, even if the wafer W is increased in size and decreased in thickness, the time required for the unloading of the wafer W by the object lifting unit 12 can be shortened, and the wafer W can be unloaded without being subject to any damages.

Further, in accordance with the preferred embodiment as described above, the mounting table 11 is designed to mount thereon either one of two types of the wafers W having diameters of 200 mm and 300 mm. Also, the first air flow path 13A is disposed at a region of the mounting surface 11A for placing thereon the wafer W of 200 mm. Thus, the unloading time of the wafer W from the mounting table 11 can be certainly reduced. Moreover, since the vacuum pump is connected with each of the first and the second air flow path 13A and 13B, and the first and the second electromagnetic valve 16 and 17 are connected to the air source to have the air flow paths 13A and 13B to selectively communicate with either one of the vacuum pump and the air source, it is possible to lift the wafer W smoothly while reducing the unloading time of the wafer W by way of terminating the communication of the air flow path 13A with the vacuum pump and setting the air flow path 13A to communicate with the air source. Furthermore, since the second electromagnetic valve 17 has the throttle valve 17A, the amount of air supplied between the mounting table 11 and the wafer W can be properly controlled.

Moreover, in accordance with the preferred embodiment of the present invention, the wafer W is slightly raised from the mounting surface 11A of the mounting table 11 by the object lifting unit 12 prior to starting the supply of air. Therefore, when it is lifted up by the object lifting unit 12 after starting the supply of air the mounting table 11 and the wafer W, the wafer W can be raised straightly upward without being misaligned at the object lifting unit 12. Also, since the wafer W is lifted up in two stages with two different rising speeds such that the wafer W is first raised slowly and then raised at a higher speed, the bending of the wafer W can be suppressed as much as possible, and the wafer W can be unloaded smoothly and quickly without being subject to damages.

The air supply unit 30 can be used with gas other than air, instead of air.

While the invention has been shown and described with respect to the preferred embodiment, it will be understood by those skilled in the art that various changes and modifications may be made without departing from the spirit and scope of the invention as defined in the following claims.

What is claimed is:

1. An unloading method of an object vacuum-chucked on a mounting table having one or more gas flow paths opened at one or more locations on the mounting table, comprising the steps of:
   (a) cutting off a vacuum in the gas flow paths, the vacuum being used in vacuum-chucking the object;
   (b) lifting the object from the mounting table by using an object lifting unit, the lifting including a first and a second lifting step, wherein an object lifting speed in the second object lifting step is higher than that in the first object lifting step, the object lifting unit includes elevating pins that contact a bottom surface of the object when lifting the object during the first and second lifting step and moves up and down with respect to the mounting table to lift the object; and
   (c) starting supplying a gas between the mounting table and the object from one or more openings opened on the mounting table only after making a gap between the mounting table and the object by lifting the object from the mounting table in step (b).

2. The method of claim 1, wherein the gas supplying step (c) is performed during the first lifting step after making the gap by lifting the object from the mounting table.

3. The method of claim 1, wherein the openings from which the gas is supplied to the gap are openings of the gas flow paths opened on the mounting table.

4. A program storage medium storing therein a computer executable program for executing the unloading method of claim 1.

5. A mounting mechanism comprising:
   a mounting table for mounting an object thereon;
   an object lifting unit moving up and down with respect to the mounting table to lift the object to and from the mounting table, wherein the object lifting unit includes elevating pins that contact a bottom surface of the object when lifting the object;
   one or more gas flow paths formed in the mounting table to be opened at one or more locations on a mounting surface of the mounting table, for vacuuming-chucking the object on the mounting table;
   a gas supply unit for supplying a gas between the mounting table and the object from one or more openings opened on the mounting table, and
   a control unit for controlling the object lifting unit and the gas supply unit so that the gas is supplied between the mounting table and the object from said one or more openings only after making a gap between the mounting table and the object by lifting the object from the mounting table using the object lifting unit,
   wherein the object lifting unit performs the lifting with at least two lifting speeds, wherein said at least two lifting speeds includes a first object lifting speed and a second object lifting speed, said second object lifting speed being higher than that said first lifting speed;
   and wherein during performing the lifting with the at least two lifting speeds, the elevating pins are contacting the bottom surface of the object.

6. The mounting mechanism of claim 5, wherein the mounting table is configured to mount thereon one of at least two types of objects having different sizes, and at least one opening of said at least one of the gas flow paths is formed in a region of the mounting table on which an object of the smallest size is placed.

7. The mounting mechanism of claim 5, wherein an exhausting unit is connected to each of the gas flow paths, and said at least one of the gas flow paths selectively communicates with either one of the exhausting unit and the gas supply unit via a valve.

8. The mounting mechanism of claim 7, wherein the valve includes a device for controlling a flow rate of the gas.

9. The method of claim 5, wherein the openings from which the gas is supplied to the gap are opening of the gas flow paths opened on the mounting table.

10. An unloading method of an object vacuum-chucked on a mounting table having one or more gas flow paths opened at one or more locations on the mounting table, comprising the steps of:
    (a) cutting off a vacuum in the gas flow paths, the vacuum being used in vacuum-chucking the object;
    (b) after the step (a), lifting the object at a first lifting speed from the mounting table by using an object lifting unit, wherein the object lifting unit includes elevating pins that contact a bottom surface of the object during lifting and moves up and down with respect to the mounting table to lift the object;
    (c) starting supplying a gas between the mounting table and the object from the one or more openings opened on the mounting table only after making a gap between the mounting table and the object by lifting the object at the first speed from the mounting table in the step (b); and
    (d) after the step (b), lifting the object at a second lifting speed which is greater than the first lifting speed.

11. The method of claim 10, wherein the first lifting speed is 1.5 mm/sec.

12. The method of claim 10, wherein the second lifting speed is 20 mm/sec.

13. The method of claim 10, wherein the openings from which the gas is supplied to the gap are openings of the gas flow paths opened on the mounting table.

14. A program storage medium storing therein a computer executable program for executing the unloading method of claim 10.

15. The method of claim 10, wherein the lifting step (b) includes the sequential steps of:
    (b1) lifting the object at the first lifting speed to thereby make the gap between the mounting table and the object;
    (b2) stopping lifting the object; and
    (b3) lifting the object at the first lifting speed again.

16. The method of claim 15, wherein the starting supplying step (c) is started during the step (b2).

17. The method of claim 15, wherein the step (b2) is performed for 50 milliseconds.

18. The method of claim 15, wherein during the step (b1), the object is lifted from a surface of the mounting table up to a distance of 0.5 mm.

19. The method of claim 15, wherein during the step (b3), the object is lifted from a surface of the mounting table up to a distance of 2.0 mm.

* * * * *